United States Patent [19]

Lu

[11] 4,119,743
[45] Oct. 10, 1978

[54] METHOD FOR MANUFACTURE OF LAMINATES WHICH ARE USEFUL AS PACKAGING MATERIALS

[75] Inventor: Chen-i Lu, Rochester, N.Y.

[73] Assignee: Eastman Kodak Company, Rochester, N.Y.

[21] Appl. No.: 821,116

[22] Filed: Aug. 2, 1977

Related U.S. Application Data

[62] Division of Ser. No. 733,560, Oct. 18, 1976, Pat. No. 4,070,398.

[51] Int. Cl.$^2$ ............................................. B05D 3/06
[52] U.S. Cl. ..................................... 427/44; 427/54; 427/388 D; 427/409; 427/410
[58] Field of Search ............... 427/44, 54, 388 D, 409, 427/410, 375, 385; 206/484, 524.2, 524.3

[56] References Cited

U.S. PATENT DOCUMENTS

| | | | |
|---|---|---|---|
| 3,140,196 | 7/1964 | Lacy et al. | 427/409 |
| 3,785,855 | 1/1974 | Sausaman et al. | 427/388 D |
| 3,922,473 | 11/1975 | Kosaka et al. | 427/409 |
| 3,959,521 | 5/1976 | Suetsugi et al. | 427/54 |
| 4,016,334 | 4/1977 | Collins et al. | 427/409 |

*Primary Examiner*—John H. Newsome
*Attorney, Agent, or Firm*—A. P. Lorenzo

[57] ABSTRACT

Heat-sealable laminates useful as packaging materials, for example, for the packaging of photographic processing chemicals, are comprised of a layer of metal foil, an outer heat-sealable layer of a radiation-cured and heat-fused polymeric composition, and a radiation-cured chemically-resistant polymeric interlayer between the foil and the outer layer. The laminates are manufactured by coating a metal foil with a radiation-curable composition that is capable of forming a chemically-resistant layer upon radiation curing, irradiating the coating to cure it, overcoating with a radiation-curable composition such as a vinyl plastisol that is capable of forming a heat-sealable layer upon radiation curing, irradiating the overcoat to cure it, and heating the laminate to fuse the overcoat layer.

13 Claims, No Drawings

METHOD FOR MANUFACTURE OF LAMINATES WHICH ARE USEFUL AS PACKAGING MATERIALS

This is a division of application Ser. No. 733,560, filed Oct. 18, 1976 now U.S. Pat. No. 4,070,398.

CROSS-REFERENCES TO RELATED APPLICATIONS

U.S. patent application Ser. No. 694,758, "Laminates Useful As Packaging Materials And Method For Manufacture Thereof," Robert F. Williams, Jr. and Chen-i Lu, filed June 10, 1976, describes heat-sealable laminates comprised of a metal foil, a thermoplastic polymeric film, and an interlayer formed by radiation curing of a composition comprising an acrylated epoxy resin. The laminates are manufactured by a process which comprises forming a sandwich comprising a layer of metal foil, a layer of thermoplastic polymer and an interlayer formed from a composition comprising an acrylated epoxy resin and irradiating the interlayer through the layer of thermoplastic polymer to cure the interlayer and bond it to both the layer of metal foil and the layer of thermoplastic polymer.

BACKGROUND OF THE INVENTION

1. Field of the Invention

This invention relates to novel laminated materials comprising a layer of metal foil overcoated with two layers of cured polymeric material. More specifically, this invention relates to heat-sealable laminates that are especially useful as packaging materials, for example for the packaging of photographic processing chemicals, which comprise a layer of metal foil, an outer heat-sealable layer of a radiation-cured and heat-fused polymeric composition, and a radiation-cured chemically-resistant polymeric interlayer between the foil and the outer layer.

2. Description of the Prior Art

Laminates which comprise a layer of metal foil bonded to a layer of thermoplastic polymer are well-known materials. As described by Marans and Addy in an article entitled "Film Lamination by Radiation-Induced Polymerization of Acrylic Acid," Journal of Applied Polymer Science, Vol. 9, pages 3661–3680, 1965, they can be prepared by using techniques such as heat plus pressure, adhesives, electric discharges, flaming, and further polymerization or crosslinking of prepolymers. The specific procedure described in detail by Marans and Addy involves the use of radiation-induced explosive polymerization of acrylic acid to form a discrete poly(acrylic acid) layer which serves as an interlayer between two films, such as a metal foil and a thermoplastic polymer film.

Prior methods of forming laminates of metal foils and thermoplastic films suffer from serious disadvantages which significantly restrict the usefulness of the resulting materials. For example, it is a common problem for the material to undergo delamination in use, especially when subjected to conditions of high temperature and high humidity. Moreover, even if delamination does not occur, the laminate may be adversely affected by the heat used in heat-sealing operations, or it may be lacking in ability to act as an effective barrier to oxygen and thereby be unable to adequately protect chemicals packaged therein from unwanted oxidation, or it may be subject to attack by common chemicals such as alkaline agents. Materials used in bonding the metal foil to the thermoplastic film may be effective as bonding agents but the bonding layer formed therefrom may be incapable of protecting the metal foil from attack by chemicals. Packaging materials used with sensitive chemicals, for example, many of the chemicals used in photographic processing, must possess a combination of characteristics such as strength, imperviousness to oxygen and moisture, and resistance to chemical attack, and laminates previously known have been lacking in one or more of these characteristics or have been incapable of being heat-sealed by common heat-sealing methods and, accordingly, have not found widespread use for this purpose.

Heat-sealable laminates prepared by the method described in copending patent application Ser. No. 694,758, which is referred to hereinabove, overcome many of the disadvantages of prior art laminates and represent an important advance in the technology of laminated packaging materials. However, there is a need for alternative manufacturing techniques which are more easily adapted to low cost mass production than the method of application Ser. No. 694,758 and it is toward the accomplishment of this objective that the present invention is directed.

SUMMARY OF THE INVENTION

In accordance with this invention, heat-sealable laminates useful as packaging materials are prepared by coating a metal foil with two different coating compositions one of which is cured by radiation to form a chemically-resistant layer and the second of which is both cured by radiation and fused by heat to form a heat-sealable layer, the chemically-resistant layer forming an interlayer between the foil and the outer heat-sealable layer. More specifically, the novel laminates of this invention are prepared by a process which comprises the steps of:

(1) coating a metal foil with a first radiation-curable composition that is capable of forming a chemically-resistant layer upon radiation curing, (2) irradiating the coating to cure such first composition, (3) overcoating the resulting cured layer with a second radiation-curable composition that is capable of forming a heat-sealable layer upon radiation curing, (4) irradiating the overcoat layer to cure such second composition, and (5) heating the overcoat layer to fuse such second composition. In each irradiation step, the irradiation can be carried out by any suitable method that is capable of curing the coated layer, for example, by exposure to ultraviolet radiation or to high energy ionizing radiation.

Laminates produced by the method described herein are strongly bonded so as to resist delamination under stringent conditions of use, provide an effective barrier to oxygen and moisture, are easily heat-sealed to form packages, and are resistant to attack by common chemicals, such as alkaline agents. They are easily prepared by a simple process involving the steps of coating, irradiating and heating which does not require the use of thermoplastic sheet material or require complex laminating operations.

DESCRIPTION OF THE PREFERRED EMBODIMENTS

The laminates of this invention can be prepared from a wide variety of different materials, with the choice of materials used depending upon the intended use of the laminate. Methods of coating and irradiating to form the desired product are similarly capable of widespread variation.

The metal foil utilized in forming the laminates of this invention can be any metal foil which exhibits impermeability toward water vapor and oxygen such that it forms a protective barrier against the penetration of these agents through the laminate so as to prevent exposure of the material in the package thereto. Foils formed from lead, aluminum, copper, steel or other metals can be utilized, with lead or aluminum foil being preferred. For reasons of ecomony, it is advantageous to use foil which is as thin as possible without loss of necessary strength. Typically, the foil that is used will have a thickness in the range from about 0.8 to about 2 mils and preferably in the range from about 1 to 1.5 mils. The strength of the metal foil utilized in this invention can be improved by adhesively laminating thin foil with paper, such lamination having no adverse effects with respect to the barrier properties of the foil. When a foil-paper laminate is utilized, the metal surface of the laminate is the surface which is in contact with the radiation-cured interlayer. Any type of paper can be used as the substrate in the paper-foil laminate, for example, cellulosic paper or synthetic papers such as those made from polystyrene or polyolefins, including non-woven and spunbonded polyolefins. Kraft paper is preferred. The overall thickness of the paper-foil laminate is typically in the range from about 2 to about 7 mils, with a preferred thickness of 3 mils. As an alternative to using a paper-foil laminate, increased strength can be provided by using a foil which comprises a metal layer on a plastic substrate, for example, a vacuum deposited metal layer.

The radiation-curable composition used in forming the chemically-resistant interlayer in the laminates of this invention can be selected from a very broad class of compositions which are curable by radiation to yield a solid plastic material which exhibits resistance to chemical attack. Useful compositions of this type can be monomers, oligomers or polymers, or mixtures thereof. While any radiation-curable composition which can be successfully coated and bonded to the foil can be used, compositions comprising an unsaturated polymer dissolved in a polymerizable monomer are particularly advantageous. It is believed that in these compositions the monomer copolymerizes with the unsaturated polymer to form a cross-linked network. A wide variety of such radiation-curable compositions are known. For example, classes of polymers which are useful for this purpose include epoxy diacrylates, unsaturated polyesters, unsaturated acrylics, unsaturated acrylic modified polyurethanes, unsaturated acrylic modified polythioethers, acrylated glycols and polyols, unsaturated vinyl-terminated polybutadienes and polybutadiene/acrylonitriles and the like. Specific examples of useful polymers are an epichlrohydrin/bisphenol-A epoxy that is reacted with acrylic acid or methacrylic acid to form acrylate or methacrylate ester end groups at both ends of the epoxy chain, as well as similar polymers prepared from novolac epoxies (fusible and soluble epoxy resins formed by condensation of a phenol with an aldehyde under acid conditions). Further examples of useful polymers are a bisphenol-A/fumaric acid polyester and a di(hydroxypropyl acrylate-anhydride) modified bisphenol-A/epichlorohydrin epoxy. Oligomers can be used in the radiation-curable composition in place of or in addition to the aforesaid polymers, for example, a polyoxyethylene diacrylate oligomer.

Further examples of polymeric materials useful in radiation-curable compositions which are suitably employed in the method of this invention are described in numerous patents, for example in U.S. Pat. Nos. 3,367,992; 3,551,235; 3,554,886 and 3,558,387.

Particularly preferred radiation-curable compositions for the purpose of forming the chemically-resistant interlayer of this invention are compositions comprising an acrylated epoxy resin. The acrylated epoxy resins are well known materials and resins of this type have been described in numerous patents, for example in U.S. Pat. Nos. 3661576, 3673140, 3713864, and 3772062 and in British patent 1375177. Typical resins of this type are those derived from bisphenols. In a preferred embodiment of this invention, the acrylated epoxy resin is a reaction product of epichlorohydrin, bisphenol-A and an acrylic monomer, such reaction product being represented by the formula:

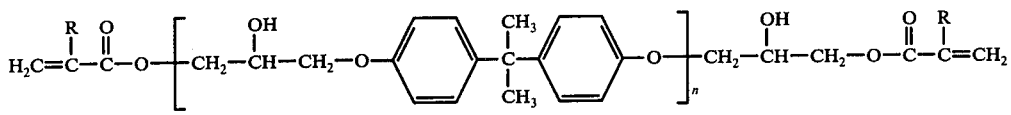

wherein R is a hydrogen atom or a methyl group and $n$ is 1 to 20. These reaction products are relatively viscous liquids when n is low, e.g., 1 to 3, which become increasingly viscous as the value of n increases and are solids when $n$ is high, e.g., 10 to 20.

When the acrylated epoxy resin is a liquid of a viscosity suitable for coating it can be used as the radiation-curable composition which forms the interlayer without the addition thereto of any solvents or diluents. When the acrylated epoxy resin is a solid it can be dissolved in a monofunctional acrylic monomer to form a composition suitable for coating. Such monomers can, of course, also be used to dilute the resin and render it less viscous when it is a liquid of too great a viscosity to be easily coated. Typical examples of monofunctional acrylic monomers useful for these purposes are acrylic and methacrylic esters such as ethyl acrylate, butyl acrylate, 2-hydroxypropyl acrylate, cyclohexyl acrylate, 2-ethylhexyl acrylate, methyl methacrylate, ethyl methacrylate, and the like. The use of 2-hydroxypropyl acrylate, or other hydroxylated monomers, should be avoided when it is desired that the laminate be highly resistant to alkaline liquids. Polyfunctional acrylates and methacrylates, i.e., those containing at least two acrylic ester groups, can also be advantageously included in the radiation-curable composition to modify such characteristics as curing rate and brittleness of the cured interlayer. Typical examples of suitable polyfunctional acrylates and methacrylates are neopentylglycol diacrylate, trimethylol propane triacrylate, 1,6-hexanediol diacrylate, 1,3-propanediol dimethacrylate, 1,3-butylene glycol dimethacrylate, and the like. The radiation-curable composition can also contain other ethylenically unsaturated monomers such as styrene, ethyl vinyl benzene, α-methyl styrene, vinyl acetate, and the like. Mixtures of two or more monofunctional acrylates, of two or more polyfunctional acrylates, and of two or more other ethylenically unsaturated monomers can also be used as desired. A preferred composition consists of an acrylated epoxy resin of the above formula, in which n is in the range of 10 to 15, dissolved in a mixture of 75 to 95 percent by weight butyl acrylate and 5 to 25 percent by weight neopentylglycol diacrylate.

In addition to the acrylated epoxy resin, the radiation-curable composition used to form the interlayer can also contain other resins which serve to modify its properties in a desirable manner, for example, it can contain resins which act to improve its adhesive characteristics. The use of such other resins is optional and dependent upon the intended use of the laminate.

A further example of a preferred class of radiation-curable compositions for the purpose of forming the chemically-resistant interlayer of this invention are compositions comprising an acrylated urethane. The acrylated urethanes are well known and commonly used in radiation-curable coatings. Materials of this type are described, for example, in U.S. Pat. Nos. 3,509,234, 3,600,539, 3,694,415, 3,719,638 and 3,775,377 and in British Pat. No. 1,321,372.

The thickness of the radiation-cured chemically-resistant interlayer can vary widely depending on the specific purpose for which the laminate is intended and the specific materials employed. It will typically have a thickness in the range from about 0.2 to about 2 mils and more usually in the range from about 0.4 to about 1 mil.

The radiation-curable composition used in forming the heat-sealable outer layer can be selected from a very broad class of compositions which are curable by radiation to form a heat-sealable layer that is strongly bonded to the underlying layer. Preferred compositions are vinyl plastisols containing a polymerizable monomer. Vinyl plastisols are liquid compositions produced by spray-drying latices obtained from the emulsion polymerization of vinyl polymers, such as poly(vinyl chloride), and dispersing the latex particles into plasticizers. Polymers typically utilized in plastisols are homopolymers of vinyl chloride, homopolymers of vinyl acetate, copolymers of vinyl chloride and vinyl acetate, and copolymers of vinyl chloride and vinylidene chloride. Typical plasticizers are phthalates such as dibutyl phthalate, methoxyethyl phthalate and dioctyl phthalate; phosphates such as tricresyl phosphate, triphenylphosphate, tributyl phosphate and trioctyl phosphate; sebacates such as dibutyl sebacate and dioctyl sebacate; adipates such as dibutyl adipate and dioctyl adipate; glycol esters; and resinous plasticizers of the linear polyester type. Polymerizable plasticizers such as diallyl phthalate can also be used. Stabilizers, such as inorganic oxides, salt of inorganic bases with weak acids, organo metallic compounds and glycidyl compounds, are also advantageously included in the plastisol. Typical examples of suitable stabilizers include organotin mercaptides, organotin carboxylates, tribasic lead sulfate, calcium-zinc stearate, barium-cadmium stearate, barium-cadmium-zinc stearate, and the like.

The vinyl plastisol can be rendered radiation-curable in accordance with this invention by the use of a polymerizable plasticizer or by incorporating a polymerizable monomer in the plastisol. Useful polymerizable monomers include ethyl acrylate, butyl acrylate, 2-ethylhexyl acrylate, hydroxypropyl acrylate, methyl methacrylate, 2-hydroxyethyl acrylate, styrene, neopentyl glycol diacrylate, 1,6-hexanediol diacrylate, diacetone acrylamide, acrylic acid, pentaerythritol tetracrylate, tetraethyleneglycol dimethacrylate, 1,3-butyleneglycol dimethacrylate, tetraethyleneglycol diacrylate, trimethylolpropane triacrylate, ethylene glycol dimethacrylate, diethylene glycol dimethacrylate, vinyl acetate and the like. Vinyl plastisols modified with acrylic monomers are described in an article entitled "Acrylic Monomers in PVC Plastisols," G. F. Cowperthwaite, SPE Journal, Vol. 29, February, 1973.

The thickness of the heat-sealable outer layer can vary widely depending on the specific purpose for which the laminate is intended and the specific materials employed. It will typically have a thickness in the range from about 0.1 to about 5 mils and more usually in the range from about 0.5 to about 1 mil.

As previously described herein, the novel laminates of this invention are manufactured by a process which comprises the steps of:

(1) coating a metal foil with a first radiation-curable composition that is capable of forming a chemically-resistant layer upon radiation curing, (2) irradiating the coating to cure such first composition, (3) overcoating the resulting cured layer with a second radiation-curable composition that is capable of forming a heat-sealable layer upon radiation curing, (4) irradiating the overcoat layer to cure such second composition, and (5) heating the overcoat layer to fuse such second composition. The first irradiation step of the process cures the coating to form a solid plastic layer that is resistant to chemical attack while simultaneously bonding such layer to the metal foil. The second irradiation step of the process cures the second coating to form a solid plastic that is heat-sealable while simultaneously bonding such layer to the cured chemically-resistant interlayer. Heating is required to fuse the particles of the plastisol and thereby impart to the heat-sealable layer the required strength and integrity. In the method of this invention, heating to fuse the plastisol will typically be carried out subsequent to irradiation of the overcoat layer. If such heating is carried out prior to irradiation of the overcoat layer, care must be taken not to heat at a temperature which will be high enough to drive off the polymerizable monomer and thereby render the irradiation step ineffective. Thus, if heating is carried out prior to irradiation, it should be carried out under conditions of time and temperature such that there will not be a serious loss of polymerizable monomer from the overcoat layer.

The two coating steps employed in the method of this invention, namely the coating of the metal foil with the radiation-curable composition that forms the chemically-resistant interlayer and the overcoating of the interlayer with the radiation-curable composition that forms the heat-sealable layer, can be carried out in any convenient manner. For example, they can be carried out by dip coating, air knife coating, roll coating, gravure coating, extrusion coating, bead coating, curtain coating, use of wire wound coating rods, and so forth. The viscosity of the coating compositions can be widely varied depending on the particular method of coating which is chosen.

Apparatus and methods for curing of radiation-curable compositions by subjecting them to suitable forms of radiation are well known and any suitable radiation curing process can be used in carrying out this invention. For example, curing can be carried out by the application of ultraviolet radiation of suitable intensity. High energy ionizing radiation such as X-rays, gamma rays, beta rays and accelerated electrons can also be used to accomplish curing of the coating. The radiation used should be of a sufficient intensity to penetrate through the coating to the substrate. The total dosage employed should be sufficient to bring about curing of the radiation-curable composition to form a solid plastic. Typically, dosages in the range of from about 0.2 to about 50 megarads, more usually in the range from about 0.5 to about 20 megarads, are employed. The coating compositions used in this invention are substantially completely convertible to a solid product so that the removal of solvents or diluents during the curing step is not necessary. In general, similar conditions for radiation curing can be employed with both the composition that forms the chemically-resistant interlayer and the composition that forms the heat-sealable outer layer. One of the coatings can, of course, be cured by use of ultraviolet light and the other by use of high energy ionizing radiation or the same method of curing can be used with both coatings.

When either of the radiation-curable compositions is cured by the use of ultraviolet radiation, a photoinitiator should preferably be included in the composition. Many photoinitiators which are useful for such purpose are known to the art, for example, butyl benzoin ether, isobutyl benzoin ether, benzophenone, benzoin, acetophenone dimethyl quinoxaline, methyl diethanol amine, 4,4'-bis(dimethylamino)benzophenone, 4,4'-bis(ethoxycarbonyl)benzoin ethyl ether, 4,4'-bis(chloromethyl)benzophenone, and the like. Such photoinitiators may be used singly or in combination. The use of photoinitiators is not necessary when curing is carried out with high energy electrons.

Curing conditions for forming the chemically-resistant interlayer should be so selected as to achieve strong bonding to the metal foil. Curing conditions for forming the heat-sealable outer layer must take into account both the need to achieve strong bonding to the interlayer and the need to keep any degradation of the interlayer caused by this curing step to a minimum. For ultraviolet light curing of either coating, good results are typically obtained by advancing the coating material at a speed in the range of 15 to 45 feet per minute under a bank of high-intensity mercury vapor lamps having a watt density of 200 watts/inch and a spectral range of 240 to 1367 nanometers. When the thickness of the coating does not exceed about 5-mils, electron curing can be satisfactorily carried out by advancing the coated material at a rate of 75 to 100 feet per minute through a 10 mA, 150 KV accelerator. When the thickness is greater than this, an electron accelerator of higher energy should be employed.

The conditions employed in heating the overcoat layer in order to fuse it can be widely varied. Typically, good results are obtained by heating for a period of about 3 to about 120 minutes at a temperature in the range from about 65° C. to about 205° C., more preferably for a period of about 4 to about 30 minutes at a temperature in the range from about 120° C. to about 180° C., and most preferably for a period of about 6 to about 15 minutes at a temperature in the range from about 130° C. to about 140° C.

The novel laminated materials of this invention are advantageously employed in the packaging of liquid chemicals. They are particularly useful in the packaging of aqueous alkaline compositions such as are commonly used in photographic processing, for example, alkaline photographic developing solutions, in view of their excellent resistance to attack by alkaline agents and impermeability to oxygen from which such solutions must be protected. Thus, a preferred embodiment of the invention is an article of manufacture comprising a container and alkaline fluid means disposed in the container, the aforesaid container being at least partially constructed from a laminate having at least first, second and third layers, the first layer being a heat-sealable polymeric layer in contact with the alkaline fluid means, the second layer being a barrier layer disposed between the first and third layers, and the third layer being a metal foil. The barrier layer is a radiation-cured layer formed by curing a radiation-curable composition which forms a solid plastic material that is resistant to chemical attack. The first layer is formed by radiation-curing and heat fusing of a composition which forms a heat-sealable polymeric material.

The invention is further illustrated by the following examples of its practice.

EXAMPLE 1

A coating composition which is radiation-curable to form a chemically-resistant layer was prepared from the following ingredients:

| Component | Parts By Weight |
| --- | --- |
| Acrylated epoxy resin | 60 |
| Butyl acrylate | 40 |
| Neopentyl glycol diacrylate | 10 |
| Isobutyl benzoin ether | 1.5 |
| 4,4'-bis(chloromethyl)benzophenone | 1.0 |

The acrylated epoxy resin was a condensation product of epichlorohydrin and bisphenol-A (molar ratio of 1.6:1) reacted with methacrylic acid to form ester end groups and is represented by the formula:

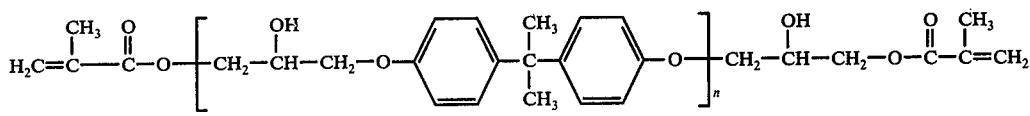

wherein $n$ has a value of about 13.

The radiation-curable composition was coated as a layer with a thickness of 1 mil on the lead surface of an adhesively bonded laminate of paper and lead foil composed of paper with a thickness of 1 mil and lead foil with a thickness of 1 mil. The coated laminate was then irradiated with UV light to cure the coating composition by passing it at a speed of 30 feet per minute through a curing chamber containing two 200 watts per linear inch, Hanovia, medium pressure, mecury type, UV lamps with the coated layer facing the UV source.

A vinyl plastisol which is radiation-curable to form a heat-sealable layer was prepared from the following ingredients:

| Compound | Parts By Weight |
| --- | --- |
| Vinyl chloride/vinyl acetate copolymer | 100 |
| Dioctyl phthalate | 36 |
| Neopentyl glycol diacrylate | 12 |
| Butyl acrylate | 12 |
| Barium-cadmium-zinc stearate | 2 |
| Isobutyl benzoin ether | 2 |

The vinyl plastisol composition was coated over the cured layer as a layer with a thickness of 1 mil and then irradiated with UV light by passing the laminate at a speed of 30 feet per minute through the curing chamber described above with the coated layer facing the UV source. Fusing of the overcoat was then carried out by heating the laminate at 140° C. for 6 minutes.

Eight 1.5-inch × 4-inch test pouches were made by folding 3-inch × 4-inch sheets of the above-described laminate and heat-sealing the heat-sealable layer on two edges with a belt-type heat sealer at 260° C. Three grams of water were carefully poured into each of a group of four pouches without touching the third edge which was then heat-sealed under the same conditions. In like manner, the remaining four pouches were filled with three grams of a 5% sodium hydroxide solution and heat-sealed. All eight of the pouches were incubated at 63° C. and a relative humidity of 15 percent for three days and then opened to permit inspection. The laminate did not exhibit any noticeable disintegration or delamination. The pouches containing water underwent an average weight loss of 0.05% while those containing the sodium hydroxide underwent an average weight loss of 1%. These results indicate that the laminate had good heat-seal strength, excellent moisture and vapor barrier properties, and good resistance to strong alkalies.

For comparison purposes, a packaging material was made by coating the lead surface of the above-described laminate of lead foil and paper with the following coating composition which is not radiation-curable:

| Component | Parts By Weight |
| --- | --- |
| Vinyl chloride/vinyl acetate copolymer | 100 |
| Dioctyl phthalate | 60 |
| Barium-cadmium-zinc stearate | 2 |

The coating composition was applied with a thickness of 1-mil and fused by heating at 140° C. for 10 minutes. Eight pouches were prepared from the resulting material in the same manner as described above the same incubation test was carried out. After incubation at 63° C. and 15 percent relative humidity for three days, the average weight loss of the pouches containing water was 85% while the pouches containing the sodium hydroxide solution had disintegrated.

For purposes of further comparison, a packaging material was made by coating the lead surface of the above-described laminate of lead foil and paper with the following radiation-curable coating composition:

| Component | Parts By Weight |
| --- | --- |
| Vinyl chloride/vinyl acetate copolymer | 100 |
| Neopentyl glycol diacrylate | 60 |
| Isobutyl benzoin ether | 5 |

The coating composition was applied with a thickness of 1-mil and cured by passing it at 30 feet per minute through the above-described curing chamber. The coated layer adhered very poorly to the lead surface and while it could be heat-sealed with the belt-type heat sealer it was so brittle that no pouches could be made for testing.

EXAMPLE 2

A laminated material was prepared in accordance with the invention which was identical to that described in Example 1 except that 50 parts of dioctyl phthalate was used in the heat-sealable layer instead of 36 parts. This resulted in a lower viscosity for easier coating and a better heat-seal with stronger bonding properties.

EXAMPLE 3

A laminated material was prepared in accordance with the invention which was identical to that described in Example 1 except that a 150 KV, 10 ma electron accelerator was used to cure each of the coatings in place of the UV lamps. In each case the total dosage employed to carry out the curing was 4 megarads. This resulted in better heat-seal strength and greater chemical inertness as a result of the accelerated electrons having more energy to carry the polymerization and/or cross-linking reactions to a higher degree of completion. Eight pouches were prepared from the laminate in the same manner as described in Example 1 and the incubation test was carried out. After incubation at 63° C. and 15 percent relative humidity for three days, the average weight loss of the pouches containing water was 0.035% while those containing the sodium hydroxide underwent an average weight loss of 0.88%.

Laminates prepared in accordance with this invention have many advantageous characteristics when used as packaging materials. In particular they are lightweight, strong and flexible, highly resistant to delamination, effective as barriers against moisture and oxygen, and highly resistant to attack by chemicals which prior art laminates are frequently incapable of withstanding. The radiation curing results in bonding of the heat-sealable material and interlayer material into a composite polymeric structure which effectively protects the metal foil and is securely joined therewith. The combined properties of the heat-sealable layer and cured interlayer are exceptionally effective in protecting the metal foil layer. The effective barrier properties and resistance to chemical attack are achieved while still retaining excellent heat-sealing properties which render the use of simple and inexpensive heat-sealing equipment practical. Manufacture of the laminate in accordance with the process described herein requires no drying step and avoids the discharge of volatile solvents into the environment. It involves only a simple process which does not require the use of a thermoplastic film as a starting material and which involves only simple coating, irradiating and heating steps. The maufacturing process is readily adapted to use with laminates of paper and metal foil which provides the advantage of extra strength and also a packaging material that has an exterior surface of paper which is, accordingly, well suited for printing of directions or advertising material on the package itself.

The invention has been described in detail with particular reference to preferred embodiments thereof, but it will be understood that variations and modifications can be effected within the spirit and scope of the invention.

I claim:
1. A method of making a laminated sheet material which comprises the steps of:
 (1) coating a metal foil with a first radiation-curable composition that is capable of forming a chemically-resistant layer upon radiation curing,
 (2) irradiating said coating to cure said first composition,
 (3) overcoating the resulting cured layer with a second radiation-curable composition that is capable of forming a heat-sealable layer upon radiation curing,
 (4) irradiating said overcoat to cure said second composition, and
 (5) heating said overcoat to fuse said second composition.

2. A method as claimed in claim 1 wherein said first and second compositions are cured by exposure to high energy ionizing radiation.

3. A method as claimed in claim 2 wherein the total dosage employed in each such curing step is in the range of from about 0.5 to about 20 megarads.

4. A method as claimed in claim 1 wherein each of said first and second compositions comprises a photoinitiator and is cured by exposure to ultraviolet radiation.

5. A method as claimed in claim 1 wherein said first composition comprises an acrylated epoxy resin.

6. A method as claimed in claim 1 wherein said first composition comprises an acrylated epoxy resin, a monofunctional acrylic monomer and a member selected from the group consisting of polyfunctional acrylates and polyfunctional methacrylates.

7. A method as claimed in claim 5 wherein said acrylated epoxy resin has the formula:

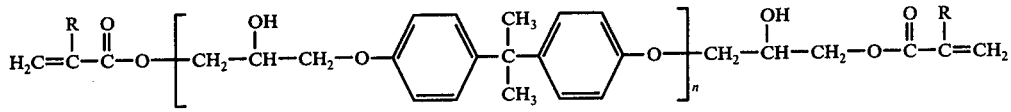

wherein R is a hydrogen atom or a methyl group and $n$ is 1 to 20.

8. A method as claimed in claim 1 wherein said second composition is a vinyl plastisol containing a polymerizable monomer.

9. A method as claimed in claim 1 wherein said second composition is a vinyl plastisol containing a vinyl chloride polymer and an acrylic monomer.

10. A method as claimed in claim 1 wherein said second composition is a vinyl plastisol containing a vinyl chloride vinyl acetate copolymer, dioctyl phthalate, neopentyl glycol diacrylate and butyl acrylate.

11. A method as claimed in claim 1 wherein said metal foil is lead foil, said first composition is comprised of butyl acrylate, neopentylglycol diacrylate, and an acrylated epoxy resin of the formula:

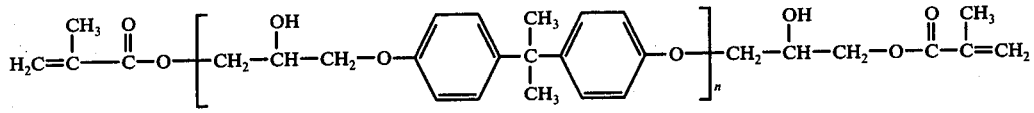

wherein $n$ has a value of about 13 and said second composition is a vinyl plastisol containing a vinyl chloride/vinyl acetate copolymer, dioctyl phthalate, neopentyl glycol diacrylate and butyl acrylate.

12. A method as claimed in claim 1 wherein said heating is carried out for a period of about 4 to about 30 minutes at a temperature in the range from about 120° C. to about 180° C.

13. A method as claimed in claim 1 wherein said heating is carried out for a period of about 6 to about 15 minutes at a temperature in the range from about 130° C. to about 140° C.

* * * * *